United States Patent
Van Wonterghem

(10) Patent No.: US 6,628,783 B1
(45) Date of Patent: Sep. 30, 2003

(54) FILTER ARRANGEMENT APPLICABLE TO ADSL SPLITTERS

(75) Inventor: Geert Arthur Edith Van Wonterghem, Eeklo (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/326,544

(22) Filed: Jun. 7, 1999

(30) Foreign Application Priority Data

Jun. 26, 1998 (EP) .............................................. 98401602

(51) Int. Cl.[7] .......................... H04M 1/76; H04M 7/00; H04M 9/00
(52) U.S. Cl. ................. 379/416; 379/93.07; 379/93.08; 379/413.02
(58) Field of Search ........................... 379/93.09, 93.07, 379/93.08, 93.31, 416, 93.02, 93.05, 413.02; 375/222

(56) References Cited

U.S. PATENT DOCUMENTS 4,727,571 A * 2/1988 Brandstetter et al.
6,144,735 A * 11/2000 Bella

OTHER PUBLICATIONS

J. Cook et al.: "ADSL and VADSL Splitter Design and Telephony Performance" IEEE Journal on Selected Areas in Communications, vol. 13, No. 9, Dec. 1995, pp. 1634–1642.

Cook J. et al.: "ADSL and VADSL Splitter Design and Telephony Performance" IEEE Journal on Selected Areas in Communications, vol. 13, No. 9, Dec. 1, 1995, pp. 1634–1642, XP000543160.

* cited by examiner

Primary Examiner—Duc Nguyen
(74) Attorney, Agent, or Firm—Sughrue Mion, PLLC

(57) ABSTRACT

A low-pass filter arrangement associated a clamping circuit for limiting unwanted transient signals to be transmitted through the filter. Mainly the variations (dI/dt) of the current flowing through the filter are eliminated. The filter may form part of a splitter used in an ADSL system to separate low frequency POTS signals from high frequency ADSL signals simultaneously transmitted over a same copper twisted-pair transmission line. The filter comprises the series connection of a coil and the main path of a transistor of which the gate terminal is connected to the opposite end of the coil. In an ADSL system, a classical 7th order low-pass filter may advantageously be replaced by a 3rd order filter arrangement.

11 Claims, 2 Drawing Sheets

FILTER ARRANGEMENT APPLICABLE TO ADSL SPLITTERS

BACKGROUND OF THE INVENTION

The present invention relates to a filter arrangement to filter signals transmitted between a first filter port and a second filter port, said arrangement including filter means adapted to filter predetermined frequency components of said signals, and associated clamping means adapted to limit the transmission of unwanted signals between said first filter port and said second filter port.

Such a filter arrangement is generally known in the art and is used to isolate the first filter port from the second filter port, and thereby the circuits, devices or apparatus connected to these ports. The signals may for instance be provided by a power supply or may be telecommunication signals whereby the filter arrangement is then used to separate different signals transmitted on a same telecommunication line but intended to different apparatus, as it is the case in a "party line" system where two telephone sets share a same transmission line, e.g. connected to the second filter port. Also many telecommunication modulation schemes use Frequency Division Multiplexing (FDM). A filter arrangement is then needed to filter the signals that an apparatus, connected to the first filter port, needs from the signals it doesn't need. Another important application of such a filter arrangement may be found in the Asymmetric Digital Subscriber Line (ADSL) systems, as well as in systems derived therefrom such as HDSL, VADSL, etc. As well known, these systems provide broadband services over a transmission line constituted by a classical twisted pair of copper wires, whereby a user may use these services without the need to wait for having a fiber connected to its premises. Since the telephone signals of the so-called Plain Old Telephone Service (POTS) are also transmitted on the same telecommunication line, a "splitter" is necessary to separate the high frequency ADSL signals, e.g. intended for an ADSL modem, from the lower frequency telephone signals, intended for a local telephone set. Such a splitter obviously includes a line filter arrangement. A high-pass filter is sitting in front of each modem, and a low-pass filter is sitting in front of each POTS interface. Additionally to this frequency filtering, the line filter arrangement needs further also to be adapted for isolating the apparatus connected a local port, e.g. the first filter port, from the transmission line connected a line port, e.g. the second filter port, and this during severe changes in voltage/ current from one of the sides of the arrangement. This may for instance be the case of spikes on the signals and that have to be eliminated.

A splitter including a filter arrangement is for instance described in the article "ADSL and VADSL Splitter Design and Telephony Performance" by J. Cook et al, published in the IEEE JOURNAL ON SELECTED AREAS IN COMMUNICATIONS, VOL. 13, NO. 9, DECEMBER 1995, pages 1634 to 1642. Therein is mentioned that splitters for ADSL, and more particularly the filters included therein, are preferably based on passive filters. The main reason therefore is that they obviate the power provision issues and ensure continued functioning in the event of power failure. Passive filters are also able to cope more easily with large signals, both voltage and current, inherent in telephony signaling and powering. Passive filters have a linear behavior as they mostly use inductors and capacitors, whilst active filters use operational amplifiers and resistors. Such a linear approach makes the design relatively easy because the Laplace-transforms and network technology can be used. Here again, there is a lot of literature available on these topics. However, this easy design is only valid if everything remains linear in all conditions. In practice however, coils that saturate are no longer linear. This means that big, and thus relatively expensive, coils need to be provided to take care that they do not saturate.

Another problem relating to ADSL applications is to avoid transient signals to be transmitted from the POTS to the ADSL side, and vice versa. Transient signals are disturbances produced, e.g., by polarity reversal of the battery or by starting of the ringing signal at the side of the telecommunication exchange, and/or by on-/ off-hook signals at the (user) side of the telephone set. To protect against the negative effects of the transient signals, large and expensive high (e.g. $7^{th}$) order filters are required as low-pass filters. Such transient and other over-current or over-voltage signals could, although not mentioned in the above known prior art, also be absorbed by clamping means such as Zener diodes adapted to eliminate voltage and/or current spikes. However, a problem with these known clamping means is that they operate in an abrupt way.

SUMMARY OF THE INVENTION

An object of the present invention is to provide a filter arrangement of the above known type but which is adapted to filter transient signals in a more efficient way while being simpler and cheaper than the one known from the prior art.

According to the invention, this object is achieved due to the fact that said clamping means include active device means adapted to limit variations of predetermined parameters of said signals.

In this way, the disturbances caused by transient or unwanted signals are progressively, and no longer abruptly, annihilated by the clamping means. Tests have proved that the worst transient signals are best attenuated by clamping means acting on the current variation or on the voltage variation of the signals rather than on the absolute value of these parameters. A combined limitation on the current/ voltage variations is also efficient.

In more detail, the present invention is characterized in that said filter means includes at least one reactive device having a first end connected to said second filter port and a second end coupled to said first filter port via a main path of said active device means which further has a control terminal coupled to said first end of said reactive device.

In this way, no power supply is required for the active device.

The present invention is further characterized in that said arrangement is a low-pass filter adapted to filter high frequency components of signals transmitted between said apparatus and said transmission line, in that said reactive device is an inductor, and in that said active device is a transistor.

It can be proved that, in case of ADSL signaling, the requirements on the filter means to filter-out the high frequency components of the signals are, in case the present arrangement is used, much less severe than those of the prior art: a $2^{nd}$(or at most a $3^{rd}$) order filter may now be used instead of the above mentioned $7^{th}$ order filter for obtaining the same results. Moreover, the inductor used in the present $2^{nd}$ order filter may be smaller than that (or those) of the prior art because it will saturate less owing to the limited current/ voltage of the signals.

In a preferred embodiment, the present invention is further characterized in that said arrangement is a low-pass filter adapted to filter high frequency components of signals transmitted between said first filter port, which has a first and a second local terminal to which said apparatus is connected, and said second filter port, which has a first and a second line terminal to which said transmission line, that is a double-wired line, is connected, in that said filter means comprises a first inductor and a second inductor as reactive device and that said active device means comprise a first transistor and a second transistor, in that said first line terminal is connected to the first end of said first inductor, the second end of said first inductor being coupled to said first local terminal via the main path of said first transistor, and the control terminal of said first transistor being coupled to said first end of said first inductor, and in that said second line terminal is connected to the first end of said second inductor, the second end of said second inductor being coupled to said second local terminal via the main path of said second transistor, and the control terminal of said second transistor being coupled to said first end of said second inductor.

In this way, the arrangement is adapted to limit either positive and negative spikes of the transmitted signals, and it operates in a fully bi-directional way.

Another characterized feature of the present invention is that said active device means further comprise a third transistor and a fourth transistor, that said first line terminal is connected to the first end of said first inductor via the main path of said third transistor, the control terminal of said third transistor being coupled to said second end of said first inductor, and that said second line terminal is connected to the first end of said second inductor via the main path of said fourth transistor, the control terminal of said fourth transistor being coupled to said second end of said second inductor.

The present arrangement then shows balanced characteristics with respect to the devices connected thereto.

The present invention is further also characterized in that said first and second line terminals are coupled via the series connected main paths of a pair of transistors of which the control terminals are connected to the first ends of said first and second inductors respectively.

The currents limited by the filter means and their associated clamping means are then derived through this pair of transistors so that the present filter arrangement remains transparent for the device connected thereto.

Further characteristic features of the present filter arrangement are mentioned in the appended claims.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
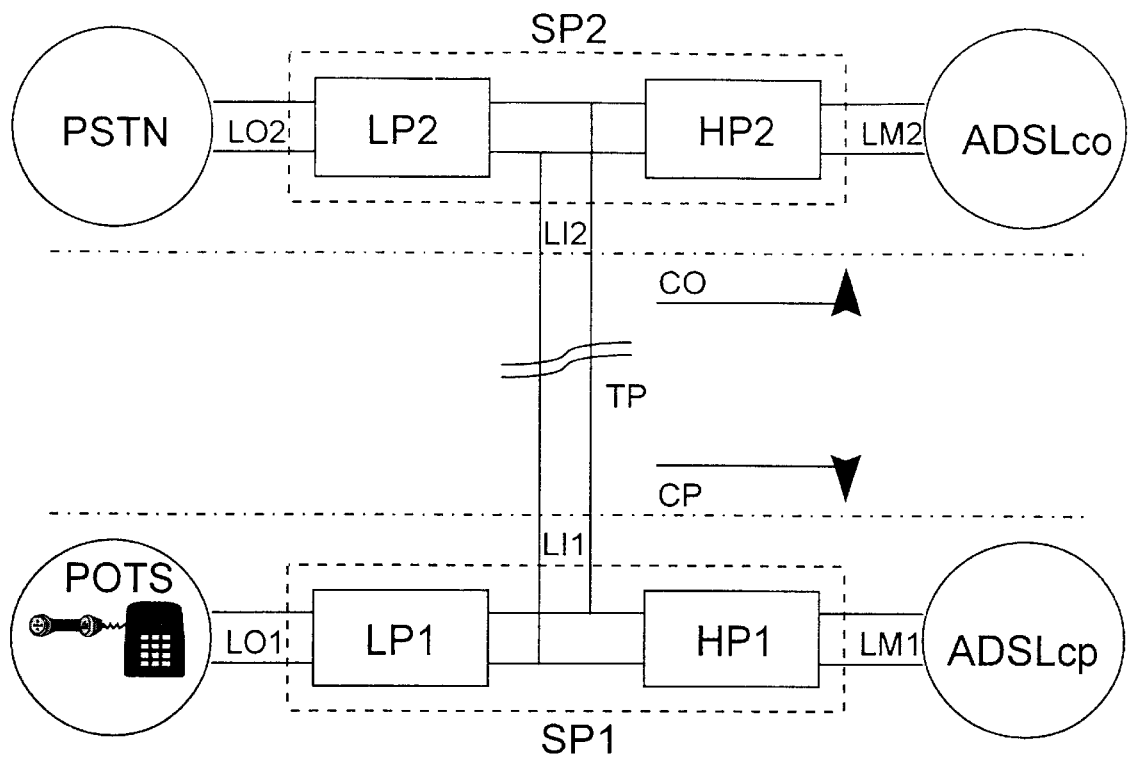
FIG. 1 is an overview of an ADSL system including a filter arrangement LP1, LP2 according to the invention.

Although not limited to any particular field of use, the filter arrangement of the present invention is particularly applicable to a splitter for an Asymmetric Digital Subscriber Line "ADSL" system as shown in FIG. 1. As known, an ADSL system—or a similar system such as HDSL, VADSL, . . . —is adapted to transmit voice and higher frequency signals over a classical copper twisted-pair telephone line TP. At each end of the twisted-pair transmission line TP is provided a splifter that separates the high frequency ADSL signals from the low frequency Plain Old Telephone Service POTS (or voice) signals. In more detail, at the customer premises side CP a splitter SP1 has a line port LI1 that connects an end of the transmission line TP both to a port LM1 of a local ADSL modem ADSLcp and to a local port LO1 of a user subscriber set POTS, whilst at the central office side CO another splitter SP2 has a line port LI2 that connects the other end of the transmission line TP both to a port LM2 of a central ADSL modem ADSLco and to a local port LO2 of a Public Switching Telecommunication Network PSTN. To this end, the splitter SP1 includes a high-pass filter HP1 that interconnects the ports LI1 and LM1, and a low-pass filter LP1 that interconnects the ports LI1 and LO1. Similarly, the splitter SP2 includes a high-pass filter HP2 that interconnects the ports LI2 and LM2, and a low-pass filter LP2 that interconnects the ports LI2 and LO2.

Figure 2:
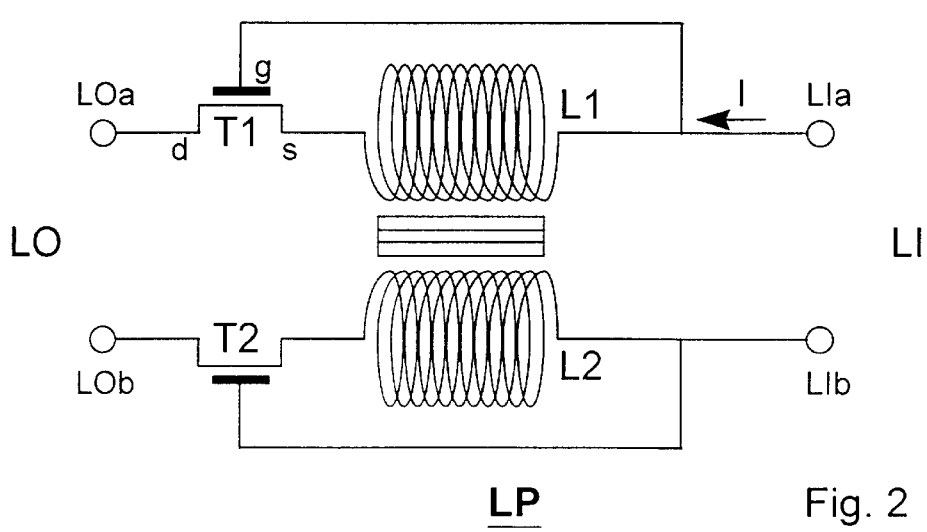
FIG. 2 shows the basic circuit LP of a filter arrangement LP1, LP2 of FIG. 1.

The present invention concerns an improved version of the low-pass filter LP1 or LP2, hereafter more generally called LP as shown at FIG. 2. This line filter arrangement LP is located between a first filter port LO and a second filter port LI, which respectively correspond to the above local ports LO1/ LO2 and line ports LI1/ LI2. The purpose of the filter LP is to isolate its two sides during severe changes in voltage/ current at one of these sides. As will be explained below, this is done by limiting or clamping the current variation dI/dt, where I is the current flowing through the filter. Although not described here, limiting the absolute value of the current I, or limiting the voltage variation dV/dt as well as combinations of all these parameters is also possible. However, practical tests show that the latter provide slightly less efficient results.

The port LI of the filter LP has two line terminals LIa and LIb, whilst the port LO has two local terminals LOa and LOb. The line terminal LIa is connected to a first end of an inductor or coil L1 of which the second end is coupled to the local terminal LOa via the source-to-drain s-d (or main) path of a first FET transistor T1. The line terminal LIa, and thus the first end of the coil L1, is further also connected to the gate g or control terminal of the transistor T1.

As well known, the voltage over the coil L1 is proportional to the variation dI/dt of the current I flowing therethrough. This voltage appears as gate-source voltage Vgs across the transistor T1 and thus determines what resistance the transistor T1 shows between its drain d and source s.

Under normal operation conditions, dI/dt is small. The induced Vgs is therefore also small and, since the transistor T1 is of the depletion type, the resistance of its main path, i.e. between d and s, is small (about 3 Ohm) and will not change significantly. The transistor T1 can then just be seen as an inter-connection and the filter operates as a normal classical inductance filter.

If the voltage, e.g. at the filter port LI, rises, the current I will increase. If this voltage change is relatively fast, the Vgs will increase rapidly and the resistance between d and s will also rise. This increase of the main path resistance of the transistor T1 has the effect of decreasing the current I, thereby counteracting the rapid change in I. The result is that this feedback mechanism limits immediately the variation dI/dt of the current I to a predetermined value. Owing to this control on the variation dI/dt, the current I will however reach its same final value but much slower than without the FET transistor T1.

The above described filter arrangement LP including the inductor L1 and the transistor T1 between the filter ports LI and LO is sufficient to limit or clamp current variations in the one direction between these ports. However, in order to limit current variations in the two directions and for both possible positive and negative spikes of the signals flowing through the filter, the series connection of a second coil L2 and second transistor T2, arranged in a same way and respectively similar to L1 and T1, needs to be provided between the line terminal LIb and the local terminal LOb. Preferably, and in order to ensure the symmetry of the arrangement, the coils LI and L2 are then magnetically coupled as shown in FIG. 2.

Figure 3:
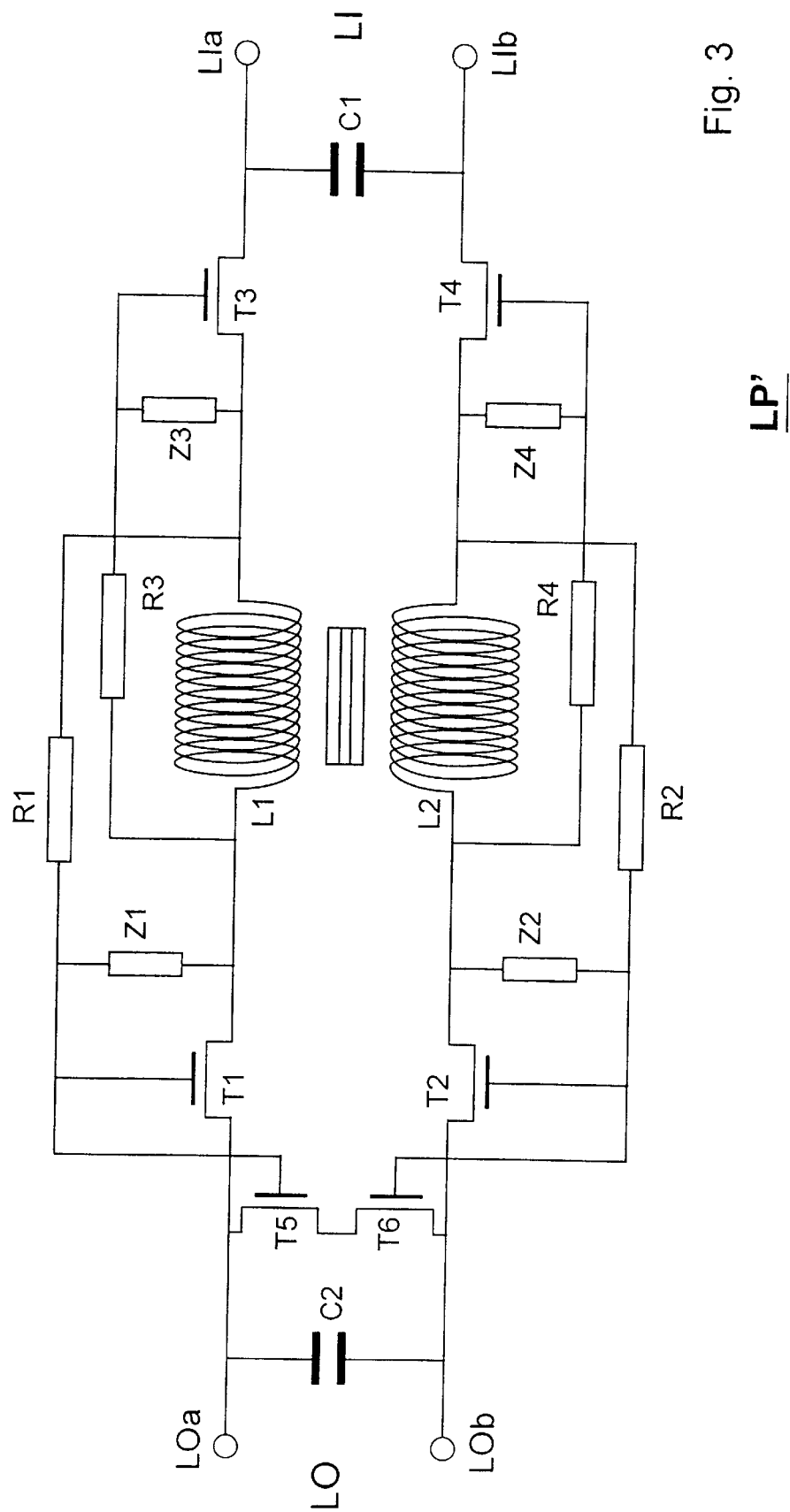
FIG. 3 is a practical implementation LP of the filter arrangement LP' of FIG. 2.

The FIG. 3 shows a more practical implementation LP' of the filter arrangement LP. Additionally to the components mentioned above in relation with LP, the filter LP' includes a third transistor T3 of which the main path connects the line terminal LIa to the first end of the coil L1, and a fourth transistor T4 of which the main path connects the line terminal LIb to the first end of the coil L2. The arrangement LP' then has balanced characteristics with respect to the devices connected thereto and the negative effect of possible common-mode signals are so eliminated To better control the operation of the filter, the gate or control terminals of the transistors T1, T2, T3 and T4 are connected to the opposite end of their associated coil via a resistor R1, R2, R3 and R4 respectively.

In case of an ADSL system as shown in FIG. 1, a $7^{th}$ order low-pass filter is generally needed to filter-out the transients of the signals. It has however been proved that by limiting the variation dI/dt of the current I as by the present arrangement, the filter may be reduced to a $3_{rd}$ order filter while providing the same results. Such a $3^{rd}$ order filter is obtained by inserting a capacitor C1 between the line terminals LIa and LIb and a second capacitor C2 between the local terminals LOa and LOb. A $2^{nd}$ order filter should also be acceptable but then with less efficient results.

The filter LP' is further protected against over-current and over-voltage by means of Zener diodes Z1, Z2, Z3 and Z4 connected between the gate and the source electrodes of the transistors T1, T2, T3 and T4.

Finally, a pair of series connected transistors T5 and T6 is provided between the local terminals LOa and LOb. The gate or control terminal of T5 is connected to the gate of T1, whilst the gate of T6 is connected to that of T2. Contrarily to the transistors T1 to T4, that all are of the depletion type, the transistors T5 and T6 are of the enhanced type. These transistors operate in a complementary way with respect to the transistors T1 to T4. In other words, when the current flow through the transistors T1–T4 decreases, the current flow through the transistors T5–T6 increases. It can be seen as the currents limited by T1–T4 are derived towards T5–T6, and that the current clamping operation is transparent for the devices connected to the present filter arrangement.

Although the above description has been made with respect to a low-pass filter arrangement, a high-pass filter arrangement may also be designed on the same principle, mainly by replacing the inductors by capacitors.

While the principles of the invention have been described above in connection with specific devices, it is to be clearly understood that this description is made only by way of example and not as a limitation on the scope of the invention, as defined in the appended claims.

What is claimed is:

1. Filter arrangement to filter signals transmitted between a first filter port and a second filter port, said arrangement comprising:

filter means to filter predetermined frequency components of said signals, and clamping means to limit the transmission of unwanted signals between said first filter port and said second filter port, wherein said clamping means comprise active transistor means to limit variations $$\frac{dI}{dt}, \frac{dV}{dt}$$

of predetermined parameters of said signals, wherein said arrangement is a line filter arrangement of which said first filter port is a local port connected to an apparatus and said second filter port is a line port connected to a transmission line and said arrangement is a low-pass filter to filter high frequency components of signals transmitted between said apparatus and said transmission line, and said filter means comprises a reactive device that is an inductor.

2. Filter arrangement according to claim 1, wherein said reactive device has a first end connected to said second filter port and a second end coupled to said first filter port via a main path of said active transistor means, and said active transistor means has a control terminal coupled to said first end of said reactive device.

3. Filter arrangement according to claim 1, wherein said apparatus is connected to a first and a second local terminal of said local port, in that said transmission line is a double-wired line connected to a first and a second line terminal of said line port, and in that said first line terminal is connected to the first end of said inductor, the second end of said inductor being coupled to said first local terminal via the main path of said transistor, and the control terminal of said transistor being coupled to said first end of said inductor.

4. Filter arrangement according to claim 1, wherein said arrangement has a first and a second local terminal to which said apparatus is connected, and said second filter port, which has a first and a second line terminal to which said transmission line, that is a double-wired line, is connected, in, that said filter means comprises a first inductor and a second inductor as reactive device and that said active transistor means comprise a first transistor and a second transistor, in that said first line terminal is connected to the first end of said first inductor, the second end of said first inductor being coupled to said first local terminal via the main path of said first transistor, and the control terminal of said first transistor being coupled to said first end of said first inductor, and in that said second line terminal is connected to the first end of said second inductor, the second end of said second inductor being coupled to said second local terminal via the main path of said second transistor, and the control terminal of said second transistor being coupled to said first end of said second inductor.

5. Filter arrangement according to claim 4, wherein said first and said second inductors are magnetically coupled.

6. Filter arrangement according to claim 4, wherein said active transistor means further comprise a third transistor and a fourth transistor, in that said first line terminal is connected to the first end of said first inductor via the main path of said third transistor, the control terminal of said third transistor being coupled to said second end of said first inductor, and in that said second line terminal is connected to the first end of said second inductor via the main path of said fourth transistor, the control terminal of said fourth transistor being coupled to said second end of said second inductor.

7. Filter arrangement according to claim 4, wherein said first and second line terminals are coupled via the series connected main paths of a pair of transistors of which the control terminals are connected to the first ends of said first and second inductors respectively.

8. Filter arrangement according to claim 4, wherein said clamping means further comprises over-voltage protection means coupled across said first and second inductors respectively.

9. Filter according to claim 1, wherein the signals transmitted on said transmission line are of an Asymmetric Digital Subscriber Line type.

10. Filter according to claim 4, wherein said first and said second local terminals are shunted by a first capacitor, and in that said first and said second line terminals are shunted by a second capacitor.

11. Filter arrangement according to claim 1, wherein said active transistor means comprise field effect transistors.

* * * * *